United States Patent
Buskens et al.

(10) Patent No.: US 10,046,298 B2
(45) Date of Patent: *Aug. 14, 2018

(54) CHEMICAL CONVERSION PROCESS

(71) Applicant: NEDERLANDSE ORGANISATIE VOOR TOEGEPAST-NATUURWETENSCHAPPELIJK ONDERZOEK TNO, 's-Gravenhage (NL)

(72) Inventors: Pascal Jozef Paul Buskens, 's-Gravenhage (NL); Maurice Christian Danho Mourad, 's-Gravenhage (NL); Maria Elizabeth Louise Wouters, 's-Gravenhage (NL); Leonardus Johannus Maria Genoveva Dortmans, 's-Gravenhage (NL); Earl Lawrence Vincent Goetheer, 's-Gravenhage (NL); Nanning Joerg Arfsten, 's-Gravenhage (NL)

(73) Assignee: NEDERLANDSE ORGANISATIE VOOR TOEGEPAST-NATUURWETENSCHAPPELIJK ONDERZOEK TNO, 'S-Gravenhage (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/587,861

(22) Filed: May 5, 2017

(65) Prior Publication Data
US 2017/0239636 A1 Aug. 24, 2017

Related U.S. Application Data

(63) Continuation of application No. 14/892,100, filed as application No. PCT/NL2014/050323 on May 21, 2014, now Pat. No. 9,670,380.

(30) Foreign Application Priority Data

May 21, 2013 (EP) .................................. 13168570
May 27, 2013 (EP) .................................. 13169298

(51) Int. Cl.
  *C08F 2/00* (2006.01)
  *B01J 19/08* (2006.01)
  *C08F 2/38* (2006.01)
(52) U.S. Cl.
  CPC ............... *B01J 19/08* (2013.01); *C08F 2/38* (2013.01); *B01J 2219/00144* (2013.01)

(58) Field of Classification Search
  CPC .......... C09D 5/00; C09D 5/32; C09D 183/06; C08F 2/38; B05D 3/06; G03F 7/16; C08K 3/36; C08K 5/098; C08K 3/16
  USPC ............................................. 526/63; 422/186
  See application file for complete search history.

(56) References Cited

U.S. PATENT DOCUMENTS

| 9,670,380 B2 * | 6/2017 | Buskens ............... C09D 183/06 |
| 2008/0154431 A1 * | 6/2008 | Defries ................... B01J 19/121 700/266 |
| 2013/0122396 A1 * | 5/2013 | Linic ..................... B01J 19/0093 429/482 |

FOREIGN PATENT DOCUMENTS

| JP | 1996217982 | | 8/1996 |
| JP | 2006312147 | A | 11/2006 |
| JP | 2007521399 | A | 8/2007 |
| JP | 2007525315 | | 9/2007 |
| JP | 2008100221 | A | 5/2008 |
| JP | 2011518650 | A | 6/2011 |
| WO | 2005060634 | A2 | 7/2005 |
| WO | 2005060635 | A2 | 7/2005 |
| WO | 2009114567 | A1 | 9/2009 |

OTHER PUBLICATIONS

Adleman et al., "Heterogenous Catalysis Mediated by Plasmon Heating", NANO Letters, vol. 9, No. 12 pp. t417-4423, (2009).*
Neumann et al., "Solar Vapor Generation Enabled by Nanoparticles", Asc Nano, vol. 7, No. 1 pp. 42-49, (2012).*
Adleman et al., "Heterogenous Catalysis Mediated by Plasmon Heating", NANO Letters, vol. 9, No. 12 pp. 1417-4423, (2009).
International Search Report and Written Opinion based on International Application No. PCT/NL2014/050323, dated Aug. 13, 2014. (11 pages).
Office Action for Japanese Patent Application No. 2016-515302 dated Jan. 30, 2018 including International Search Report and translation (total 14 pages).

* cited by examiner

*Primary Examiner* — William Cheung
(74) *Attorney, Agent, or Firm* — Lucas & Mercanti, LLP

(57) ABSTRACT

The invention relates to a chemical conversion process and to a process for removing particles from a reaction mixture. The chemical conversion process of the invention includes plasmonic heating of a reaction mixture having at least a one component and plasmonic particles, by exposing the reaction mixture to light having one or more wavelengths which are absorbed by at least part of the plasmonic particles, thereby controlling the reaction rate of one or more chemical reactions.

18 Claims, No Drawings

CHEMICAL CONVERSION PROCESS

CROSS-REFERENCE TO RELATED APPLICATIONS

This is a continuation of U.S. patent application Ser. No. 14/892,100, filed Nov. 18, 2015, now issued as U.S. Pat. No. 9,670,380, which is a 371 of PCT/NL2014/050323, filed May 21, 2014, which claims the benefit of European Patent Application No. 13168570.3, filed May 21, 2013 and European Patent Application No. 13169298.0, filed May 27, 2013, the disclosure of each of which is incorporated by reference.

FIELD OF THE INVENTION

The invention relates to a chemical conversion process and to a process for removing particles from a reaction mixture.

BACKGROUND OF THE INVENTION

Temperature can be used to control and change one or more reaction rates in (bulk) chemical conversion processes. For example, heating is often used to increase a reaction rate. On the other hand, in case of a thermally labile catalyst, such as an enzyme, heating can also be used to decrease a reaction rate. Accordingly, precise control of the temperature of a bulk chemical reaction mixture is often required to control one or more reaction rates. In addition, high pressure is often applied to obtain a sufficient reaction rate for gas phase reactions.

Conventional heating methods do not allow for near instantaneous, fast and/or local heating of components of a fluid phase. For instance, heating a liquid at 75° C. for only one second is difficult using conventional means. In addition, chemically selective heating, i.e. providing thermal energy from an external source to one or more selected components of a fluid mixture is difficult using conventional means. For example, it is difficult to selectively heat enzymes in a liquid, which would be render them inactive.

Most research on plasmonic particles, such as noble metal nanoparticles, has focussed on their optical properties, in particular their enhanced scattering. The enhanced light absorption and associated heating of such particles were considered as (mostly unwanted) side effects in plasmonics applications. Only recently it has been sought to use plasmonic particles as heat source. Applications are mostly in biomedicine, for example in photo-thermal cancer therapy and bio-imaging.

Steam reforming of ethanol inside a micro-channel using plasmonic heating by gold nanoparticles has been described by Adleman et al. (*Nano Letters* 2009, 9, 4418-4423). A laser (50 mW, 10±2 μm diameter) at or near the frequency of the plasmon resonance (532 nm) of ~20 nm gold nanoparticles is focused on the top of a glass support, and the subsequent heat generated in the nanoparticles is transferred to the surrounding fluid which forms a vapour. The vapour phase components react forming gas bubbles which are carried downstream in a microfluidic 40 μm height glass/polydimethylsiloxane (PDMS) channel. The particles are attached to a glass support.

Neumann et al. (*ACS Nano* 2013, 7, 42-49) describe solar vapour generation using broadly absorbing metal or carbon nanoparticles dispersed in a liquid phase. They report an increase of the surface temperature of the nanoparticles above the boiling point of the liquid. Vapour that formed around the nanoparticles resulted in bubbles composed of nanoparticles enveloped by a vapour shell. The bubbles, comprising nanoparticles, moved to a liquid-air interface where steam was released. They also describe distillation of ethanol-water mixtures (20 ml) with Au nanoshell particles in dispersion ($2.5 \times 10^{10}$ particles/ml) using focused sunlight. In this document, particles are separated from an evaporated compound rather than a liquid component.

US-A-2008/0 154 431 to Defries describes means to use at least a form of light-matter interaction, to generate localised conditions that enable initiation of chemical reactions. It mentions a strong interaction of light with a metallic nanoparticle. The temperature of the nanoparticle is raised. A method is described incorporating metallic nanoparticle catalyst and the use of light-matter interactions to control localised thermal conditions to control catalytic chemical reactions including polymerisation.

OBJECT AND SUMMARY OF THE INVENTION

An objective of the invention is to provide a chemical conversion process having improved control over a reaction rate of one or more chemical reactions. Surprisingly, it has been found that this objective can, at least in part, be met by performing such chemical conversion processes using plasmonic heating.

DETAILED DESCRIPTION OF THE INVENTION

In a first aspect, the invention relates to a chemical conversion process comprising plasmonic heating of a reaction mixture, which reaction mixture comprises at least a one component and plasmonic particles, by exposing said reaction mixture to light comprising one or more wavelengths which are absorbed by at least part of the plasmonic particles. In this fashion, the reaction rate of one or more chemical reactions can be controlled.

The surface plasmon resonance effect that results from a strong interaction between light and nanostructures metals allows for development of a new generation of processing technologies and photonic devices. The surface plasmon resonance effect may be addressed by the absorption of electromagnetic energy at or near the surface plasmon resonance frequency. This phenomenon may be exploited to open new pathways for chemical synthesis and reactions that are thermodynamically unfavourable under current processing conditions. Reactions in which metallic nanoparticles provide the catalytic sites are, for instance, excellent candidates for exploiting surface plasmon excitations. Synthesis routes or chemical reactions that benefit from local heating by surface plasmons are termed plasmon enhanced. Chemical reactions can also be plasmon enhanced through the ability to locally control temperatures and enable rapid heating and cooling. Generating local heat through the use of plasmon excitations allows reactions to be stimulated in a low temperature environment. Local heat generation will thus give rise to a local temperature increase in proximity to the heated volume of material without heating the entirety of the reactor mass or surrounding environment. In some cases quantum effects associated with metal nanoparticles can be addressed to cause further unique behaviour and increase reactivity of such particles.

The phrase "controlling a reaction rate" as used in this application is meant to include both adjusting a reaction rate (increasing and/or decreasing) and maintaining a constant reaction rate. Hence, controlling a reaction rate does not necessarily require the reaction rate to change.

The phrase "exposing a reaction mixture to light" as used in this application is meant to include both irradiating the reaction mixture with light and illuminating the reaction mixture. The light can typically have a photon energy in the range of about 0.3 to about 3.5 eV and can accordingly comprise ultraviolet (UV), visible, near-infrared (NIR), and infrared (IR) light. The light is preferably continuous (CW), but alternatively a pulsed light source can be used. The light can be focused (e.g. a laser beam), the reaction mixture can also be homogenously exposed e.g. to ambient light, solar light, light emitting diode (LED) light. In an embodiment, substantially the entire reaction volume of a reaction mixture is illuminated, in particular in case of a batch chemical conversion process. The light to which the reaction mixture is exposed may be monochromatic, but may also span a specific range of the spectrum.

The term "nanoparticles" as used in this application is meant to refer to particles with at least one dimension of from about 1 to about 1000 nm, such as from about 1 to about 500 nm, from about 2 to about 300 nm or from about 5 to about 200 nm. These dimensions can be measured with laser diffraction as the volume median (Dv50), at least above 10 nm. For smaller particles transmission electron microscopy (TEM) can be used based on number average, equivalent sphere diameter. This includes spherical or approximately spherical (cuboidal, pyramidal) particles with a diameter (or at least two or three dimensions) in these ranges. In case of spherical particles the one dimension is preferably the diameter of the particles. For non-spherical particles, the one dimension can, for instance, be the equivalent spherical diameter which is defined as the diameter of a sphere of equivalent volume. The term "nanoparticle" is also meant to include rod-like nanoparticles, also known as nanorods. Such nanorods typically have an aspect ratio (longest dimension divided by the shortest dimension) in the range of 2-40, more often in the range of 2-20, such as in the range of 3-10. Typically, each of the dimensions of a rod-like nanoparticle is in the range of from about 1 nm to about 1000 nm.

The term "metallic surface nanoparticle" as used in this application is meant to refer to nanoparticles comprising a surface, said surface comprising at least one metal. Preferably, the surface of the nanoparticles is exposed to (such as in direct contact with) the reaction mixture. The term metallic surface nanoparticle is meant to include metal nanoparticles as well as core-shell nanoparticles with at least a metal-comprising shell and a metallic or non-metallic core. The core can, for instance, be a dielectric material, or a semiconductor material.

The term "plasmon" as used in this application is meant to refer to surface plasmons. By analogy, the term "plasmonic" as used in this application is meant to refer to the presence of surface plasmons. The term "plasmonic particle" as used in this application is meant to refer to a surface-plasmon supporting structure. A plasmonic particle typically is a nanoparticle of a conducting material. This conducting material can be a metal or metallic material, but for instance also carbon. This term is meant to include structured surfaces and nanoparticles comprising conductive materials. Plasmonic particles are characterised by exhibiting plasmon resonance. The plasmon resonance can be at one or more specific plasmon resonance wavelengths. Rod-like nanoparticles, for example, can have two distinct plasmon resonance wavelengths, one derived from the longer dimension of the particle and the other deriving from the shorter dimension of the particle. It is also possible that plasmon resonance occurs within a certain spectral range. This may depend, for instance, on the particle size distribution of the plasmon particles.

The term "plasmonic heating" as used in this application is meant to refer to the release of heat from a plasmonic particle due to the absorption of light through plasmonic resonance. Also encompassed by the term "plasmonic heating" is the situation where a plasmon particle is brought into the excited state by absorption of light after which the plasmon particle relaxes from this "hot state" via a charge transfer (such as an electron transfer) to one or more reactants or one or more catalysts.

The phrase "light comprising a plasmonic resonance wavelength" as used in this application is meant to include light with a wavelength coinciding with a plasmonic resonance wavelength. For example, if a plasmonic resonance wavelength exists at 350 nm, monochromatic light of 350 nm would be considered light comprising the plasmonic resonance wavelength, but also an ultraviolet light source providing a spectrum of from 200 nm to 400 nm would be considered light comprising the plasmonic resonance wavelength. If the spectrum of the applied light (for example the spectral output of the light source) encompasses the plasmonic resonance wavelength, then the light can be considered light comprising the plasmonic resonance wavelength. The phrase "light comprising electromagnetic waves that are at least partially concentrated by the plasmonic particles" as used in this application is meant to include light with a wavelength coinciding with a plasmonic resonance wavelength of the particles.

The term "thermolabile" or thermally labile includes compounds that are liable to decomposition above a certain temperature, wherein the decomposition is typically unwanted and typically involves a loss of functionality of the component.

The invention described herein may be used for the control (i.e. initiation of a reaction, increase of reaction rate, decrease of reaction rate, maintaining specific reaction rate, or termination of a reaction) of chemical conversion reactions (including catalytic chemical conversion reactions and chemical syntheses). The reactions may be exothermic or endothermic.

Preferably, the reaction mixture comprises a liquid component, preferably a solvent. The liquid component is preferably volatile and preferably has a boiling point in the range of 20-200° C., such as in the range of 50-150° C. Preferably, the liquid component has a boiling point of 5-200° C. higher than the bulk temperature of the reaction mixture, more preferably 10-100° C. higher. Accordingly, in case of a cooled reaction mixture, the boiling point can even be below 0° C., for example if the bulk temperature is below −10° C. Preferably, the reaction mixture is a non-gaseous fluid reaction mixture, such as a liquid mixture, solution, suspension, emulsion, foam, polymer melt, or colloidal suspension.

The reaction mixture can also be gaseous; in that case the plasmonic particles are preferably supported, for example on and/or in a support material. The support material may be porous. In case the particles are not supported, the plasmonic particles are dispersed in a medium, typically a liquid medium.

The plasmonic particles preferably have a plasmon resonance wavelength in the infrared (700 nm to 10 μm), near-infrared (700-1400 nm), visible (400-700 nm) and/or ultraviolet spectrum (300-400 nm). The wavelength of such resonances strongly depends on the size and morphology of the plasmonic particle and the refractive index of its environment. Preferably, the plasmonic particles exhibit plasmonic enhanced absorption of at least one wavelength in these ranges.

Surface plasmons as used herein comprise coherent electron oscillations that exist at the interface between two suitable materials such as a conductive material and a dielectric.

Plasmonic particles suitable have a size smaller than the wavelength of the plasmon resonance. The reaction mixture preferably comprises a dielectric phase.

Plasmonic particles preferably comprise a conductive surface. Accordingly, the plasmonic particles in a reaction mixture preferably form an interface between a conductive surface of the plasmonic particle and a dielectric phase of the reaction mixture.

The plasmonic particles can be free (such as dispersed in a liquid phase), such as in suspension in a liquid. They can also be immobilised, for example on a surface, or on and/or in a support material. The surface and/or support material are preferably dielectric and preferably have a relatively low thermal conductivity and/or a thermal barrier with the plasmonic particle, such as due to low phonon coupling. The support material can comprise a porous material such as a zeolite or porous alumina or silica. The plasmonic particles can also be immobilised on a surface of a reactor.

The plasmonic particles can have morphologies including spherical, elongated, rod-like, cuboidal, pyramidal, nanostars.

The plasmonic particles comprise a conducting material, such as a metal or carbon. The plasmonic particles can preferably comprise metal nanoparticles and/or nanoparticles with a metal nanoshell. Suitable metals include one or more selected from the group consisting of Ag, Al, Au, Cu, Ni, Co, Pd, Pt, In, Sn, Zi, Ti, Cr, Ta, W, Fe, Rh, Ir, Ru, Os, and Pb. Preferably, the metals are selected from the group consisting of Ag, Al, Au, Cu, Ni, Co, Pd, Pt, and Rh. The metals may be present as alloys. Also metal-metal core-shell particles are possible. Carbon is advantageous in terms of costs.

The plasmonic particles may comprise a shell comprising such metals and a core comprising a material different form the shell. Examples of suitable plasmonic particles include $SiO_2$/Au nanoshells, metal coated chalcogenide II-VI nanoparticles, such as gold coated CdTe nanoparticles and gold coated CdSe nanoparticles. For example, suitable plasmonic particles include $SiO_2$/Au nanoshells prepared by suspending 120 nm silica nanoparticles (e.g. commercially obtainable from Precision Colloids, Inc.) in ethanol, functionalising with 3-aminopropylthriethoxysilane, adding gold colloidal particles (1-3 nm) which are adsorbed on the amine groups and act as seed for growth of the nanoshell by reacting $HAuCl_4$ with the seeds in the presence of formaldehyde (Neumann et al., *ACS Nano* 2013, 7, 42-49). It is further possible that the nanoparticles have a solid metal shell filled with another substance which may be a non-solid. Examples of substances that can be contained in metal shells are insulators or dielectric materials such as water, gases (such as nitrogen, argon and neon), aqueous gels (such as polyacrylamide gels and gels containing gelatine), and organic substances such as ethanol. Typical organic fillers for metal shells are lipids, long-chain fatty acids, organic hydrocarbons, and other organic compounds comprising straight-chain hydrocarbon chains of 14 or more carbon atoms.

The plasmonic particles can also comprise carbon nanoparticles, for example Carbon black N115 commercially available from Cabot, Inc. Graphitic particles can also be used.

Preferably, the plasmonic particles comprise one or more selected from the group consisting of:
(i) metal nanoparticles comprising one or more metals selected from the group consisting of Ag, Al, Au, Cu, Ni, Co, Pd, Pt, Rh,
(ii) core-shell nanoparticles comprising a core comprising a dielectric material and a shell comprising one or more metals selected from the group consisting of Ag, Al, Au, Cu, Ni, Co, Pd, Pt, Rh,
(iii) core-shell nanoparticles comprising a core comprising one or more metals selected from the group consisting of Ag, Al, Au, Cu, Ni, Co, Pd, Pt, Rh and a shell comprising a dielectric material, and
(iv) carbon nanoparticles comprising carbon in an electric conductive form.

Preferably, the particles are dispersed in a liquid phase of said reaction mixture, more preferably, uniformly dispersed.

Preferably, nanoparticles used as plasmonic particles are modified at their exposed surface to increase stability. Preferably, the nanoparticles comprise stabilisers, for example grafted molecules, for example natural or synthetic polymers, for steric stabilisation. Examples include PVA (polyvinyl alcohol), poly(vinylpyrrolidone) (PVP) and sodium citrate. Preferred are surfactants for stabilisation, for example one or more arboxylates, phosphines, amines, thiols, and/or grafted polymer brushes. The nanoparticles may also comprise, as an alternative or in addition, charged compounds as stabilisers for electrostatic stabilisation. Surfactants are preferably used for stabilisation, in particular in case the liquid desiccant composition comprises metal salts in an amount of for example more than 1 wt. %. Moreover, silica-stabilisation of (gold) nanoparticles is also possible.

Plasmonic heating comprises release of heat from a plasmonic particle due to the absorption of light through plasmonic resonance. The electromagnetic field of the light can result in excitation of surface plasmons by resonant coupling which can be converted into heat. The energy not re-radiated through light scattering is dissipated, resulting in a temperature increase in the nanometer-scale vicinity of the particle surface.

Preferably, the plasmonic heating results in evaporation of a liquid component of the reaction mixture and the formation of a vapour shell around the plasmonic particle. The formation of a vapour shell around the plasmonic particles affects the plasmonic heating. Without wishing to be bound by way of theory, the inventors believer that this is due to the different dielectric constant of the vapour and the lower thermal conductivity coefficient of vapour, compared to the liquid. For a particle in water (liquid) at 25° C., a temperature increase to 34° C. can be expected, based on steady state heat-transfer for a (laser beam) power density of $6.4 \times 10^8$ $Wm^2$ (Adleman et al., *Nano Letters* 2009, 9, 4418-4423). However, the lower thermal conductivity of water vapour (0.015 $Wm^{-1}K^{-1}$) compared to that of water (0.6 $Wm^{-1}K^{-1}$) is believed to explain at least partly the capacity of plasmonic particles to generate a vapour bubble around them. It is thus rather surprising that plasmonic heating can be used in chemical conversion processes.

Preferably, the plasmonic heating is localised. Preferably, the plasmonic heating results in heating of the direct proximity of the plasmonic particles (for example up to 2 μm around the plasmonic particles or up to 1 μm around the plasmonic particles). This is to say, preferably the temperature of the plasmonic particles is 20° C. or higher than the bulk temperature of the reaction mixture, preferably at least 50° C. higher, more preferably 100° C. higher. This provides as advantage that heating can be more efficient. The temperature of plasmonic particles can be calculated by applying Fourier's law at the particle interface (($P=G \cdot S \cdot (T_p-T_s)$), wherein P represents the power absorbed by the particle, G represents the effective interfacial thermal conductance, S represents the surface area of the particle, $T_p$ represents the particle temperature, and $T_s$ represents the surrounding temperature). The temperature can also be obtained from surface-enhanced Raman scattering (SERS) measurements.

In an aspect, the reaction mixture comprises a liquid component and plasmonic heating comprises the formation of a vapour layer around plasmonic particles. The lower thermal conductivity of the vapour is believed to cause thermal insulation of the plasmonic particle, a temperature increase of the plasmonic particle and further evaporation of liquid components of the reaction mixture.

Based on the Laplace equation, small bubbles have a high internal pressure. For example, a 3 μm bubble has an inner pressure of 2 bar surrounded by water at 1 bar.

In an aspect, the plasmonic heating therefore preferably causes the formation of bubbles which provide a high temperature, high pressure environment for chemical reactions.

The invention can be applied on varies scales, ranging from analytical scale to bench scale to bulk scale. These terms each have their conventional meaning, depending on the technical field of application. More in particular, the reaction mixture can for instance have a volume of less than about 1 μm$^3$, in the range of 1 μm$^3$-10 μm$^3$, in the range of from about 10 μ$^3$ to about 1 mm$^3$ to about 1 mm$^3$, in the range of from about 1 mm$^3$ to about 100 mm$^3$, in the range of from about 100 mm$^3$ to about 1 dm$^3$, in the range of from about 1 dm$^3$ to about 1 m$^3$, or more than 1 m$^3$. Preferably, the chemical conversion process is a bulk process, such as a process wherein the reaction mixture has a volume of more than 1 dm$^3$, preferably more than 1 m$^3$. Alternatively, the chemical conversion process can comprise, for example, a microfluidic process (e.g. lab-on-a-chip) or a nanofluidic process.

The chemical conversion process can be a continuous process or a batch process. In a continuous process, the plasmonic heating can occur at a specific stage of the process by illuminating the reaction mixture at one or more parts in the reactor. In a batch process in a batch reactor, the entire reactor volume (or parts thereof) can be illuminated at various stages of the reaction. It can be advantageous to use a reactor having a reflective inner surface such that light not absorbed by the reaction mixture is reflected back.

Examples of chemical reactions that may be comprised in the chemical conversion processes of the invention include the following: synthesis of hydrocarbons from carbon monoxide and hydrogen, steam reforming, acetylation, addition reactions, alkylation, dealkylation, hydrodealkylation, reductive alkylation, amination, aromatisation, arylation, caronylation, decarbonylation, reductive carbonylation, carboxylation, reductive carboxylation, reductive coupling, condensation, cracking, hydrocracking, cyclisation, cycloo-ligomerisation, dehalogenation, dimerisation, epoxidation, esterification, exchange, halogenation, hydrohalogenation, homologation, hydration, dehydration, hydrogenation, dehydrogenation, hydrocarboxylation, hydroformylation, hydrogenolysis, hydrometallation, hydrosilation, hydrolysis, hydrotreating, hydrodesulphurisation/hydrodenitrogenation (HDS/HDN), isomerisation, methanol synthesis, methyl-ation, demethylation, metathesis, nitration, partial oxidation, polymerisation, reduction, steam and carbon dioxide reforming, sulphonation, telomerisation, transesterification, trimerisation, water gas shift (WGS), and reverse water gas shift (RWGS).

In the chemical conversion process of the invention the reaction mixture is exposed to light of which one or more wavelengths are absorbed by at least a part of the plasmonic particles. Such light includes light comprising electromagnetic waves that are at least partially concentrated by the plasmonic particles. In practice, the light source may be provided, for example, within a transparent enclosure in the centre of a reactor such that it has optimal penetration depth in the reaction mixture. The transparent enclosure can for example be a quartz or glass enclosure. Other means for suitably exposing the reaction mixture to the light (and optimal conditions for obtaining a desirable penetration depth) are well-known to the person skilled in the art from classical conventional and photochemical conversions. For example, when the sun is used as light source, it is commonly known to use a focussing concentrator.

In an embodiment, controlling a reaction rate of one or more chemical reactions comprises carrying out a plurality of at least partly successive chemical reactions in one reactor in an order determined through plasmonic heating, preferably in case of a bulk chemical conversion process. The successive reactions are typically different from each other. Typically for two or more of said successive chemical reactions, a product of an earlier reaction is a starting material for a later reaction, typically the direct subsequent reaction.

Various specific approaches of this aspect of the invention are described hereinafter. These methods can be used as independent methods and in combinations with each other.

Preferably, the temperature of at least part of said plasmonic particles is increased to 100-500° C., preferably to 150-400° C. Preferably, at least the surface temperature of said plasmonic particles is raised to a temperature within this range.

Preferably, the temperature difference between at least part of said plasmonic particles and a liquid phase of the reaction mixture is at least 20° C., more preferably at least 50° C., even more preferably at least 100° C.

Preferably, the reaction mixture comprises 0.01 wt. % or more of plasmonic particles, more preferably 0.1 wt. % or more, even more preferably 1 wt. % or more, typically less than 5 wt. %, based on the weight of the reaction mixture.

The chemical conversion process comprises exposing the reaction mixture to light. At least part of the reaction mixture is exposed to light, alternatively the entire reaction mixture.

Preferably, the light is spatial non-coherent light. Laser beams are spatial coherent, spatial non-coherent light includes light from divergent light sources such as sunlight, light emitting diode (LED) light, incandescent and luminescent (fluorescent and/or phosphorescent) light.

Preferably, the plasmonic heating of the plasmonic particle is in the range of $10^7$-$10^{16}$ W/m$^3$, such as $10^9$-$10^{14}$ Wm$^3$, for example $10^{10}$-$10^{13}$ Wm$^3$.

Preferably, the light intensity (irradiance) is preferably $10^2$ W/m$^2$ or more, such as $10^2$-$10^9$ W/m$^2$, more preferably $10^3$-$10^8$ W/m$^2$, typically at the surface of the reaction mixture. Preferably, the spectral irradiance is 0.1 Wm$^{-2}$nm$^{-1}$ or more at a plasmon resonance wavelength of the plasmonic particles; such as 0.1-10 Wm$^{-2}$nm$^{-1}$, preferably 0.4-2 Wm$^{-2}$nm$^{-1}$;typically as measured at the surface of the reaction mixture. Herein such a plasmon resonance wavelength is optionally a wavelength wherein the absorption cross-section of the plasmonic particles is more than 0.001 µm², preferably more than 0.01 µm². Preferably, the light exposure lasts for a duration of at least 1 s, such as at least 10 s.

Preferably, the absorption cross-section of the plasmonic particles is more than 0.001 µm² at a plasmon resonance wavelength, such as more than 0.01 µm², preferably over a range of 100 nm or more, more preferably 500 nm or more within the 300-2500 nm range, preferably within a 380-700 nm range. The exact absorption cross-section to be used depends on the desired application. For instance, if a multi-sequence reaction is intended where each of the sub-reactions is to be carried out after one another, one would like to turn on and turn off various sub-reactions highly selectively and monochromatic light (or near monochromatic light) would be optimal (such as by using a laser as light source). On the other hand, if the intention is to use sunlight to mediate a chemical conversion or to store (solar) energy in the form of chemicals (solar fuel), then a broad absorption and an efficient harvesting of the solar spectrum is desired. In such a case it can be advantageous to use a mixture of various plasmonic particles that have a complementary absorption spectrum so that a large part of the solar spectrum is covered.

In a suitable embodiment, the light to which the reaction mixture is exposed is or is derived from sunlight. Accordingly, the invention also relates to storing solar energy by a chemical conversion process as described and using the sun as light source.

The chemical conversion process can suitably involve one or more catalysts, in particular solid catalysts. It is well known that solid catalysts and systems employing solid catalysts can limit or restrict the speed and efficiency of chemical reactions. There issues require more precise control of catalyst heating and more precise placement of catalysts and chemicals. The plasmonic heating of the invention allows for rapid switching between low and high temperature states of catalyst particles. At low temperatures reactions proceed slowly, generating high molecular sticking probabilities. At high temperatures reactions proceed quickly and rapid desorption of reactants from catalyst particles is ensured. Rapidly cycling the temperature of catalyst particles permits exploiting the thermodynamics of a reaction at preferred processing temperatures. The invention enables to address instantaneous delivery of localised focused heating to a desirable catalyst in a structure permitting precise placement to the desired chemical, reactant or product.

In a further aspect, the invention relates to a chemical conversion process as described herein, wherein said reaction mixture comprises a first plasmonic particle associated with a first catalytic functionality for a first chemical reaction and a second plasmonic particle associated with a second catalytic functionality for a second chemical reaction, wherein said first plasmonic particle is different from said second plasmonic particle and said first catalytic functionality is different from said second catalytic functionality, wherein said first and second plasmonic particles both have a plasmon resonance wavelength, which plasmon resonance wavelengths differ by at least 2 nm, preferably at least 20 nm, the method comprising exposing said reaction mixture to light comprising a plasmon resonance wavelength of said first plasmonic particle (first type light), thereby selectively promoting said first chemical reaction, and thereafter exposing said reaction mixture to light comprising a plasmon resonance wavelength of said second plasmonic particle (second type light), thereby selectively promoting said second chemical reaction.

Preferably, the plasmonic particle is associated with a catalytic functionality by being co-located with a catalyst, such as a catalyst attached or directly or indirectly connected to the plasmonic particle. A plasmonic particle can also be associated with a catalytic functionality by exhibiting a catalytic activity, but it is not required that the plasmonic particles exhibit catalytic activity for one or more of the chemical reactions.

Preferably, the first and second chemical reactions are different from each other.

The plasmon resonance wavelengths of said first and second plasmonic particles differ from each other by at least 2 nm, preferably at least 20 nm, more preferably at least 50 nm. Of course, the appropriate difference should be selected in view of the used first and second type light, and/or the used types of light are selected in view of the types of plasmonic particles.

Preferably, the first and second type plasmonic particles have at least a first wavelength at which the absorption of the second type plasmonic particle is 10% or less of the absorption of the first type plasmonic particle at that wavelength, and a second wavelength at which the absorption of the first type plasmonic particle is 10% or less of the absorption of the second type plasmonic particle at that wavelength. More preferably, the first and second type plasmonic particles have at least a first wavelength at which the absorption of the second type plasmonic particle is 1% or less of the absorption of the first type plasmonic particle at that wavelength, and a second wavelength at which the absorption of the first type plasmonic particle is 1% or less of the absorption of the second type plasmonic particle at that wavelength.

Preferably, said first type light has an intensity (spectral irradiance) at plasmon resonance wavelengths of the second plasmonic particle that is 10% or less, such as 1% or less, of the intensity of the light at plasmon resonance wavelengths of the first plasmonic particle. In this way, exposing the reaction mixture to first type light results in selective plasmonic heating by the first plasmonic particle compared to the second plasmonic particle. Preferably, said second type light has an intensity at plasmon resonance wavelengths of the first plasmonic particle that is 10% or less, such as 1% or less, of the intensity of the light at plasmon resonance wavelengths of the second plasmonic particle.

Preferably, selectively promoting (including initiating, controlling and stopping) said first or second chemical reaction comprises selectively activating said first or second type catalyst, respectively. Selectively promoting said first or second chemical reaction can also be effected through the effect of temperature on the reaction rate according to Arrhenius law.

Accordingly, the first and second catalyst can be activated using different wavelengths of lights. This can be useful for cascade reactions and/or can be used to control reaction sequences in an one-pot chemical process. Accordingly, the activity of the first and second catalyst is preferably temperature dependent. Exposure of the reaction mixture to light of the first wavelength thus causes plasmonic heating by the first plasmonic particle.

Preferably, the first catalyst is selectively associated with the first plasmonic particle and not, or less, with the second plasmonic particle. The second catalyst is preferably selectively associated with the second plasmonic particle and not, or less, with the first plasmonic particle.

An association between a catalyst and a plasmonic particle indicates that an increase of the temperature of a plasmonic particle by plasmonic heating results in an increase of the catalyst activity. A catalyst associated to a plasmonic particle is thus directly or indirectly linked to a plasmonic particle. For example, they can form a catalyst-plasmonic particle conjugate. The catalyst can thus be immobilised on or to a plasmonic particle.

For example, if catalyst A catalyses reaction A→B and catalyst B catalyses reaction B→C, catalyst A can be immobilised to first type plasmonic particles having a plasmon resonance wavelength of for instance 500 nm and catalyst B can be immobilised to second type plasmonic particles having a plasmon resonance wavelength of for instance 800 nm. Both types of immobilised catalyst can then be mixed together with reactant A. The reaction A →B can then be started by exposure of the reaction mixture to 500 nm light. Only the direct vicinity of the first type plasmonic particles is heated due to plasmonic heating of the first type plasmonic particles and the reaction A→B starts to run. The B catalyst remains at room temperature and reaction B→C does not run. At complete conversion of A to B the 500 nm light exposure can stop and 800 nm light exposure can start. Only the B catalyst will be heated by plasmonic heating of the second type plasmonic particles and only the reaction B→C will run. At full conversion to C, the 800 nm light exposure can end. If necessary, the plasmonic particles with immobilised catalyst can be separated by centrifugation and product C can be purified. Accordingly, reactions A→B and B→C can run subsequently in a single reaction vessel, whereas hitherto separate reactors for each were required. It will be clear that the mentioned plasmon resonance wavelengths of 500 nm and 800 nm are purely exemplary and may be any two other wavelengths depending on the plasmonic particles used. As mentioned before, plasmonic heating can also include that a charge transfer (e.g. electron transfer) takes place from an excited state (viz. "hot state") plasmon particle to one or more reactants or one or more catalysts.

Preferably, in this aspect of the invention the first catalyst comprises a homogenous catalyst, such as a transition metal complex, that is immobilised. By means of immobilisation this homogeneous catalyst becomes a heterogeneous catalyst. Preferably, the first plasmonic particle comprises a metallic surface nanoparticle directly or indirectly attached to a catalyst.

Such a complex can be immobilised to a plasmonic particle through its ligands and/or a linker. For example, the linker can be covalently bound to a capping ligand of a metallic surface nanoparticle as plasmonic particle. The linker can also have a capping end capping a metallic surface nanoparticle and a functionality acting as ligand to a transition metal ion. The plasmonic particles can also be capped metallic surface nanoparticles with a catalyst, such as transition metal complexes, supported on the capping shell. Suitable linkers and ligands include those having thiol functionality, in particular for gold nanoparticles. Other potential functionalities for metal particles are amine or phosphate.

The ligands may be non-functionalised, polyhomo- or polyheterofunctionalised. Polyhomofunctionalised means that the same chemical moiety has been used to modify the ligand at various positions within the ligand. Polyheterofunctionalised means that different chemical moieties or functional groups are used to modify the ligands at various positions. Chemical moieties suitable for functional modification include, but are not limited to, bromo, chloro, iodo, fluoro, amino, hydroxyl, thio, phosphino, alkylthio, cyano, nitro, amido, carboxyl, aryl, heterocyclyl, ferrocenyl, and heteroaryl.

Preferably, the first and second plasmonic particle expose at least one different metal on their surface. In this way, a first plasmonic particle can comprise first catalyst and a second plasmonic particle can comprise a second catalyst. In addition, the plasmonic particles can be metal nanoparticles capped with a different protective shell with different transport properties for the components involved in the first and second reaction. The plasmonic particles can also be capped with different ligands contributing to catalytically activity. These approaches can also be combined. In this way, the plasmonic particles can act as heterogeneous catalysts selectively for the first or second chemical reaction.

The invention also relates to a reaction mixture comprising a first plasmonic particle associated with a first catalytic functionality for a first chemical reaction and a second plasmonic particle associated with a second catalytic functionality for a second chemical reaction, wherein said first and second plasmonic particles both have a plasmon resonance wavelength, which plasmon resonance wavelengths differ by at least 2 nm, preferably at least 20 nm.

In a further aspect, the reaction mixture is fluid and comprises at least a first and second fluid preferably liquid component and the chemical conversion process comprises removing said first component at least partly by evaporating at least part of said first component by plasmonic heating, thereby forming a vapour layer comprising said first component around plasmonic particles and transporting plasmonic particles with said vapour layer, preferably by their buoyancy, to an interface of a first phase comprising said reaction mixture and a second phase. Such a process can be referred to as plasmon-assisted evaporation. Accordingly, said plasmonic particles are dispersed in the reaction mixture, or free, in the form of a suspension in a liquid reaction mixture.

Preferably, said first and second component are liquid components of the reaction mixture. Preferably, said first phase is fluid and non-gaseous, such as a liquid, emulsion or suspension. The second phase can be, for example, a gaseous phase and/or a fluid phase with a lower density than the first phase. Accordingly, the first and second components have a difference in volatility. The process can further comprise condensing said first component (plasmon-assisted distillation) and collecting said first component.

This provides the advantage that plasmonic particles generate heat very locally. In this way, a first component in a first phase (e.g. a liquid phase and/or fluid non-gaseous phase) can be removed from the first phase and transferred to a second phase (e.g. a gas phase). Preferably, the second phase has a lower density than the first phase and an interface with the first phase. Preferably, the first phase comprises a plurality of fluid or liquid components with different boiling points and is preferably a non-azeotropic mixture of these components.

Generally, plasmonic particles enclosed by a vapour phase can be considered a bubble with a lower density than the first phase (lower mass than the displaced water) and a larger Reynolds number compared to the plasmonic particle. The bubble can thus float upwards (relative to gravity) by its buoyancy. It follows necessarily that in the case of that preferred embodiment of bubbles floating upwards, with the particle in the bubble, that the plasmonic particle is dispersed in the medium, which medium is a liquid phase. The process can comprise release of the vapour phase into the second phase at an interface between the first and second phase. Plasmonic particles can then, after release of a vapour shell, sink in the first phase and be recycled for removing first component from the first phase anew.

Such a plasmon-assisted evaporation process can be integrated in a chemical conversion process to remove a product component, for example of an equilibrium reaction. For example, a condensation reaction, such as an esterification or iminisation reaction requires removing water to obtain full conversion. Accordingly, the invention also relates to a chemical conversion process as described, comprising plasmon-assisted evaporation.

In yet a further aspect of the invention, the plasmonic heating initiates an exothermic reaction. This can be used for initiation of exothermic reactions, preferably exothermic reactions having a moderate to high activation energy such as 50 kJ/mol or more, or 100 kJ/mol or more. An advantage of this initiation method is that it is safer, as the reaction is initiated locally. Since excess heat in an exothermic reaction can lead to undesirable local temperature increase, and possibly catalyst overheating, a means to control removing or transferring some of the heat is desired. Pre-heating the whole reaction mixture is not required. Plasmonic particles can thus be used to generate heat very locally via a light flash. For example, the light exposure can be for a time period of 0.1 s-1 min, or 0.01 s -10 s, or about 1 s, or even less than 0.01 s, such as 1 ms or less. Plasmonic heating is believed to generate heat at the picosecond time scale. In addition, the light exposure can spatially selective, such as by using a laser beam or a mask. The initiation can thus be spatially selective. In this way, a reaction can start whilst the bulk reaction mixture is still at room temperature. This method provides safe and easy control of such reactions.

In yet a further aspect, the chemical conversion process comprises a polymerisation reaction and the plasmonic heating controls heat generation in the polymerisation reaction. Preferably, the plasmonic particles are suspended in a liquid phase in the reaction mixture, which typically comprises a resin. In an optional embodiment, the plasmonic particles are not catalytic for the polymerisation reaction and/or the polymerisation is not catalysed by the catalytic particles. In an optional embodiment, the reaction mixture comprises a polymerisation catalyst which is different from the plasmonic particles. Suitably, the reaction mixture comprises a thermal hardening resin such as one or more selected from acrylyl, polycarbonate, polychloride vinyl, urethane (hence an isocyanate with for example a polyol), melamine, alkyd, polyester, and epoxy.

Preferably, the reaction mixture comprises a polymerisable components, such as monomers and/or oligomers, preferably radical polymerisable components (e.g. (meth) acrylic acids) and/or cationic polymerisable components (in particular ethylenically unsaturated compounds, e.g. olefin monomers (in particular styrene), lactones, lactams, and/or cyclic amines; and epoxy and/or vinyl ether). The reaction mixture comprises preferably one or more reaction initiations, such as free radical polymerisation initiators and cationic polymerisation initiators, preferably thermal polymerization initiators. Preferred free radical thermal initiators include compounds that are thermally liable to decompose into radicals to generate polymerisation of radical polymerisable components. Preferred examples include azo compounds, and inorganic and organic peroxide compounds, such as 4,4'-azobis(4-cyanovaleric acid); 4,4'-azobis (4-cyanovaleric acid); 1,1'-azobis(cyclohexanecarbonitrile); 2,2'-azobis(2-methylpropionamidine) dihydrochloride; 2,2'-azobis(2-methylpropionitrile); ammonium persulphate, hydroxymethanesulphinic acid monosodium salt dehydrate, potassium persulphate, sodium persulphate, 2,2-bis(tert-butylperoxy)butane, tert-butyl hydroperoxide solution, tert-butyl hydroperoxide, benzoyl peroxide (BPO). The reaction mixture can comprise initiator and monomer and plasmonic particles and no solvent, or with solvent (bulk and solution polymerisation). The process can also be based on suspension polymerisation or emulsion polymerisation.

The chemical conversion process may comprise a polymerisation reaction. During such a process, properties of the reaction mixture can drastically change. For example, the viscosity can increase making stirring difficult. For these and other reasons, hot spots can form in the reactor causing undesired side reactions. The invention provides a method to mitigate effects of such hot spots and avoid their formation by using plasmonic heating. Addition of energy to the reaction system via plasmonic heating is highly controlled and localised. In an aspect, it can be turned on and off throughout the reaction mixture by turning the light exposure on and off. This allows for quick responses. In this way, the method provides more control over the reaction and thus polymer products with improved properties. While the plasmonic particles make it possible to initiate and/or control the reaction with light, the system is not restricted to conventional UV-curing polymerisation. The polymerisation reaction may provide a cured article. The invention also relates to such article. This article comprises the cured polymer and plasmonic particles. Curing may involve polymerisation and cross-linking, e.g. of monomers and/or oligomers. The method of manufacturing the article may comprise moulding the reactive mixture but in particular additive fabrication of the reactive mixture, in particular with stereolithograpy.

In a further aspect, the reaction mixture comprises a thermally deactivatable catalyst and the plasmonic heating deactivates said catalyst at least in part. Such a catalyst can also be described as thermolabile.

The term "deactivatable catalyst" as used in this application is meant to refer to any catalyst that can be quenched or rendered inactive by heating above a deactivation temperature. The deactivatable catalyst can, for example, comprise an enzyme. A thermally deactivatable catalyst can be deactivated, such as quenched or rendered inactive, by a temperature increase. Such a catalyst thus has a deactivation temperature, for example of 50° C. or more, 90° C. or more, 100° C. or more, 150° C. or more and typically less than 200° C. The catalyst preferably has a deactivation temperature in the range 50-200° C., such as 60-130° C. Deactivation typically involves a reduction of the catalyst activity by 90% or more, for example denaturation or degradation of an enzyme. Deactivation in particular refers to permanent inactivation.

The thermally deactivatable catalyst may comprise an enzyme, transition metal complex with thermolabile ligands, and thermolabile organic catalysts. The person skilled in the relevant field is familiar with and will recognise such thermally deactivatable catalysts.

Preferably, the thermally deactivatable catalyst is attached to a plasmonic particle. This can be based on non-specific interaction between enzymes and metallic surface nanoparticles and also based on using capping groups as linker. This linkage by capping groups may be the same as described above for non-thermally deactivatable catalysts.

For example, the plasmonic particles may comprise an enzyme-nanoparticle conjugate. Hitherto, such conjugates were mostly used as biosensor or as a carrier. The enzyme can be attached, for example covalently attached, to the plasmonic particle or metal nanoparticle either directly or indirectly through a linker.

The plasmonic particles can also be attached to, or provided to, a compound with a high affinity for an enzyme, such as antibodies, fragment antigen-binding (FAB) fragments, the substrate or a compound for which the enzyme has a high affinity.

In this way, the catalyst is in close proximity to plasmonic particles. Preferably, the deactivatable catalyst is in such proximity to a plasmonic particle that it will be entrapped in a bubble formed by plasmonic heating.

This aspect allows for quick deactivation of a catalyst by a short light pulse (generally less than 1 s).

In a further aspect, the reaction mixture comprises a precursor of a solid material and said plasmonic heating induces reactive deposition of said solid material on a plasmonic particle. This allows for producing core-shell particles. As the duration and amount of plasmonic heating can be precisely controlled by adjusting the duration and intensity of the light exposure, highly monodisperse core-shell particles can be obtained.

Accordingly, in an aspect the invention relates to a method for forming core-shell nanoparticles, comprising providing a reactive mixture comprising at least one precursor for a solid material and plasmonic particles, the method comprising exposing said reaction mixture to light comprising one or more wavelengths which are absorbed (such as concentrated) by at least part of the plasmonic particles.

Preferably, the particles are dispersed in the reaction mixture, preferably in suspension in a liquid phase of the reaction mixture. This can provide more effective heating compared to plasmonic particles bonded on a substrate (in particular metal nanoparticles covalently bonded to reactive groups on a modified glass substrate), because heat dissipation through the substrate is avoided. This allows for more effective heating of the liquid phase around the particles. Optionally, a vapour bubble can form around the particles, providing further thermal insulation of the particles. As the reactive deposition comprises chemical conversion of the precursor, which is typically also in the liquid phase, e.g. suspended, dissolved or mixed, reactive deposition can be promoted.

The solid material is preferably a metal, metal oxide or polymer, for example silica. Precursors for the polymers are resins as described, optionally in combination with free-radical and/or cationic initiators as described. The precursor of the solid material is preferably a thermo-liable precursor such as a metal alkoxide, for example tetraethyl orthosilicate (TEOS), or a thermolabile metallic precursor.

The precursor may comprise silica sols also known as colloidal silica, silicic acid, polysilicic acid. The precursor may also comprise a polysilicate microgel, silica hydrogel and/or silica particles, preferably with hydroxylated surfaces. In an embodiment, the precursor component can comprise a metal alkoxyde, nitrate, halide (fluoride, bromide, chloride, or iodide) and/or carboxylate (such as acetate, propionate or butyrate), preferably in an amount of 1-90 wt. %, more preferably 5-50 wt. %, by weight of reaction mixture.

The metal to be deposited can, for instance, be selected from the group consisting of scandium, yttrium, lanthanum, actinides, lanthanides, titanium, zirconium, hafnium, vanadium, niobium, tantalum, chromium, molybdenum, tungsten, manganese, technetium, rhenium, iron, ruthenium, osmium, cobalt, rhodium, iridium, palladium, nickel, copper, zinc, cadmium, aluminium, gallium, indium, silicon, germanium, tin, lead, antimony, and bismuth. Preferred metals include aluminium, iron, zirconium, magnesium and silicon are preferred. Metal alkoxides of aluminium, iron, zirconium, magnesium and silicon are particularly preferred. Alkoxydes, nitrates, halides, and/or carboxylates of phosphorus or boron are suitable alternatives to their metal analogues.

Preferably, the metal alkoxydes are represented by the general formula $M(OR)_x$ or $R_yM(OR)_x$, in which M represents a metal such as Ti, Al, Fe, Zr, Mg, Sr, and Si, and each R independently represents an organic alkyl group such as methyl, ethyl, propyl isopropyl, butyl, or aromatic groups. Each of x and y independently represent an integer with a value selected from 1, 2, 3, 4, 5, and 6. Preferably, said metal is silicon and R is methyl or ethyl. Preferably, the precursor component comprises an alkoxysilane (including aryltrialkoxysilanes). Sol-gels on the basis of Si remain stable for a longer period of time than sol-gels based on the other metals mentioned above. A person of skill in the art would be aware of the wide range of metal or metalloid containing compounds which have been employed in the sol-gel process and which, thus, may be candidates for use in the invention. The reaction mixture preferably comprises 0.1-99 wt. %, more preferably 5-50 wt. % of the example compounds listed under 1-4.

1. In case the metal is silicon, examples of the curable component include trimethoxysilane, triethoxysilane, tripropoxysilane, tetramethoxysilane (also known as tetramethyl orthosilicate), tetraethoxysilane (also known as tetraethyl orthosilicate), tetrapropoxysilane, methyltrimethoxysilane, ethyltrimethoxysilane, propyltrimethoxysilane, methyltriethoxysilane, ethyltriethoxysilane, propyltriethoxysilane, dimethyldimethoxysilane, diethyldiethoxysilane, γ-chloropropyltriethoxysilane, γ-mercaptopropyltrimethoxysilane, γ-mercaptopropyltriethoxysilane, γ-aminopropyltriethoxysilane, phenyltrimethoxysilane, phenyltriethoxysilane, phenyltripropoxysilane, diphenyldimethoxysilane, and diphenyldiethoxysilane.

Among these, particularly preferred are tetramethoxysilane, tetraethoxysilane, methyltrimethoxysilane, ethyltrimethoxysilane, methyltriethoxysilane, ethyltriethoxysilane, dimethyldimethoxysilane, dimethyldiethoxysilane, phenyltrimethoxysilane, phenyltriethoxysilane, diphenyldimethoxysilane, and diphenyldiethoxysilane.

2. In case the metal is aluminium, examples of the curable component include trimethoxy aluminate, triethoxy aluminate, tripropoxy aluminate, and tetraethoxy aluminate.

3. In case the metal is titanium, examples of the curable component include trimethoxy titanate, tetramethoxy titanate, triethoxy titanate, tetraethoxy titanate, tetrapropoxy titanate, chlorotrimethoxy titanate, chlorotriethoxy titanate, ethyltrimethoxy titanate, methyltriethoxy titanate, ethyltriethoxy titanate, diethyldiethoxy titanate, phenyltrimethoxy titanate, and phenyltriethoxy titanate.

4. In case the metal is zirconium, examples of the curable component include trimethoxy zirconate, tetramethoxy zirconate, triethoxy zirconate, tetraethoxy zirconate, tetrapropoxy zirconate, chlorotrimethoxy zirconate, chlorotriethoxy zirconate, ethyltrimethoxy zirconate, methyltriethoxy zirconate, ethyltriethoxy zirconate, diethyldiethoxy zirconate, phenyltrimethoxy zirconate, and phenyltriethoxy zirconate.

For example, the reaction mixture can comprise a molecular silica precursor and the plasmonic heating can induce reactive deposition of silica from said precursor on at least part of the plasmonic particles. The deposition can be carried out, e.g., under Stöber conditions (Stöber et al., *Journal Colloid Interface Science* 1968, 26 (1), 62-69).

In an aspect, the invention relates to a process for removing particles from a reaction mixture comprising at least a first liquid component and said particles, wherein said nanoparticles are plasmonic particles, comprising evaporating at least part of said first component by plasmonic heating, forming a vapour layer comprising said first component around plasmonic particles, transporting plasmonic particles with said vapour layer by their buoyancy and separating said plasmonic particles from at least part of said reaction mixture, in particular from at least part of said liquid component. Preferably, the plasmonic particles are those as used in a chemical conversion process of the invention and such chemical conversion process preferably comprises a separation step according to this process for removing particles. The process for removing particles is in particular advantageous for valuable nanoparticles such as nanoparticle catalyst, such nanoparticles comprising precious metals such as Pt, Au, Ag. Separation of very small particles from a liquid reaction mixture is rather difficult with current methods. The method provides as advantage that selective solid particles can be removed, by tuning the wavelength only some particles can be heated while other particles are not and remain in solution, for example particles that are not plasmonic.

Accordingly, plasmon-assisted evaporation can cause at least part of the plasmonic particles to form a vapour bubble around them, resulting in a drift of the particles. This drift can be to a liquid-air interface and upward (floating movement). Separating said plasmonic particles from at least part of said liquid component of said reaction mixture can comprise skimming of the particles, such as by skimming off an upper layer of the liquid reaction mixture, decanting, removing a liquid bottom part. The process may further comprise collecting the plasmonic particles. A chemical conversion process as described herein may comprise such removing particles in this way.

Vapour layers around nanoparticles can provide buoyancy. This is believed to be due, without wishing to by way of theory, both to the lower effective density and the increased Reynolds number of the plasmonic particle with the vapour layer around it, acting as a bubble, compared to the plasmonic particle. The larger size of such bubbles (e.g. more than 4 µm after 20 ms), compared to the particles, causes an increase in the Reynolds number. As the bubbles can be much larger than the nanoparticles, the effective density of the bubble can be close to the density of the gas and the Reynolds number larger. Accordingly, the settling velocity of the bubble can be larger compared to that of the particle as follows from Stokes' law.

In yet a further aspect the plasmonic particles are consumed in the chemical conversion process. For example, a product of the chemical conversion can comprise the plasmonic particles as a functional component. The plasmonic particles can induce a substantial functionality in the chemical product, such as a colour effect, or an effect on conductivity.

The various embodiments and aspects of the invention described herein may optionally be combined as desired.

The invention may be applied, for instance, for storing energy, in particular from fluctuating, preferably renewable sources, such as solar energy and wind energy, preferably in the form of chemicals (such as solar fuels). This can be done with significantly higher efficiency than by using classical semiconductors and preferably a large part of the solar spectrum may be used (not only ultraviolet and blue light). Another preferred application is controlling complex reaction sequences and thereby reducing the costs of processes and products. The invention allows running multiple reactions in sequence without having to physically intervene in the reaction vessel. It allows a better control over the onset and offset of the various sub-reactions and the total reaction can be performed in with less effort and in less time. The better control over the reaction also allows an increased product quality since side reactions leading to unwanted side products can be reduced or prevented.

The invention claimed is:

1. Chemical conversion process comprising:
   plasmonic heating of a reaction mixture, which reaction mixture comprises at least a one component and plasmonic particles, by exposing said reaction mixture to light comprising one or more wavelengths which are absorbed by at least part of the plasmonic particles, thereby controlling the reaction rate of one or more chemical reactions,
   wherein said process comprises a polymerisation reaction and the plasmonic heating controls heat generation in said polymerisation reaction, and
   wherein the plasmonic particles are suspended in a liquid phase in the reaction mixture.

2. Chemical conversion process according to claim 1, wherein the temperature of at least part of said plasmonic particles is increased to 100-500° C.

3. Chemical conversion process according to claim 1, wherein the mixture comprises 0.1 wt. % or more of plasmonic particles, based on the weight of the reaction mixture.

4. Chemical conversion process according to claim 1, wherein a temperature difference between plasmonic particles and a liquid phase of the reaction mixture is at least 20° C.

5. Chemical conversion process according to claim 1, wherein the light is spatial non-coherent light.

6. Chemical conversion process according to claim 1, wherein the plasmonic particles comprise one or more selected from the group consisting of:
   (i) metal nanoparticles comprising one or more metals selected from the group consisting of Ag, Al, Au, Cu, Ni, Co, Pd, Pt, Rh,
   (ii) core-shell nanoparticles comprising a core comprising a dielectric material and a shell comprising one or more metals selected from the group consisting of Ag, Al, Au, Cu, Ni, Co, Pd, Pt, Rh,
   (iii) core-shell nanoparticles comprising a core comprising one or more metals selected from the group consisting of Ag, Al, Au, Cu, Ni, Co, Pd, Pt, Rh and a shell comprising a dielectric material, and
   (iv) carbon nanoparticles comprising carbon in an electric conductive form.

7. Chemical conversion process according to claim 1, wherein said particles are uniformly dispersed in a liquid phase of said reaction mixture.

8. Chemical conversion process comprising:
   plasmonic heating of a reaction mixture, which reaction mixture comprises at least a one component and plasmonic particles, by exposing said reaction mixture to light comprising one or more wavelengths which are absorbed by at least part of the plasmonic particles, thereby controlling the reaction rate of one or more chemical reactions,
   wherein said plasmonic heating initiates an exothermic reaction.

9. Chemical conversion process comprising:
   plasmonic heating of a reaction mixture, which reaction mixture comprises at least a one component and plasmonic particles, by exposing said reaction mixture to light comprising one or more wavelengths which are absorbed by at least part of the plasmonic particles, thereby controlling the reaction rate of one or more chemical reactions,
wherein said reaction mixture comprises a thermally deactivatable catalyst and the plasmonic heating deactivates said catalyst at least in part.

10. Chemical conversion process according to claim 8, wherein the temperature of at least part of said plasmonic particles is increased to 100-500° C.

11. Chemical conversion process according to claim 8, wherein the light is spatial non-coherent light.

12. Chemical conversion process according to claim 8, wherein said particles are uniformly dispersed in a liquid phase of said reaction mixture.

13. Chemical conversion process according to claim 9, wherein the temperature of at least part of said plasmonic particles is increased to 100-500° C.

14. Chemical conversion process according to claim 9, wherein the light is spatial non-coherent light.

15. Chemical conversion process according to claim 9, wherein said particles are uniformly dispersed in a liquid phase of said reaction mixture.

16. Chemical conversion process according to claim 1, wherein the reaction mixture in which the plasmonic particles are suspended in the liquid phase thereof further comprises a polymerisable component.

17. Chemical conversion process according to claim 8, wherein the exothermic reaction has an activation energy of 50 kJ/mol or more, and wherein the light exposure is spatially selective light exposure.

18. Chemical conversion process according to claim 9, wherein the thermally deactivatable catalyst is attached to at least one of said plasmonic particles.

* * * * *